(12) United States Patent
Sadaka et al.

(10) Patent No.: US 9,511,996 B2
(45) Date of Patent: Dec. 6, 2016

(54) METHODS OF FORMING SEMICONDUCTOR STRUCTURES INCLUDING MEMS DEVICES AND INTEGRATED CIRCUITS ON COMMON SIDES OF SUBSTRATES, AND RELATED STRUCTURES AND DEVICES

(71) Applicant: Soitec, Crolles Cedex (FR)

(72) Inventors: Mariam Sadaka, Austin, TX (US); Bernard Aspar, Saint-Ismier (FR); Chrystelle Lagahe Blanchard, Crolles (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/416,860

(22) PCT Filed: Jul. 8, 2013

(86) PCT No.: PCT/IB2013/001488
§ 371 (c)(1),
(2) Date: Jan. 23, 2015

(87) PCT Pub. No.: WO2014/020388
PCT Pub. Date: Feb. 6, 2014

(65) Prior Publication Data
US 2015/0210540 A1    Jul. 30, 2015

Related U.S. Application Data

(60) Provisional application No. 61/677,808, filed on Jul. 31, 2012.

(51) Int. Cl.
*H01L 27/14* (2006.01)
*B81C 1/00* (2006.01)
(Continued)

(52) U.S. Cl.
CPC ......... *B81C 1/00246* (2013.01); *B81B 7/0006* (2013.01); *B81C 1/00238* (2013.01);
(Continued)

(58) Field of Classification Search
CPC .................................................. B81C 1/00246
See application file for complete search history.

(56) References Cited

U.S. PATENT DOCUMENTS

| | | |
|---|---|---|
| 6,303,468 B1 | 10/2001 | Aspar et al. |
| 6,335,258 B1 | 1/2002 | Aspar et al. |

(Continued)

FOREIGN PATENT DOCUMENTS

| | | |
|---|---|---|
| CN | 101519183 A | 9/2009 |
| CN | 101837944 A | 9/2010 |

(Continued)

OTHER PUBLICATIONS

International Search Report for International Application No. PCT. IB2013/001488 dated Nov. 4, 2013, 4 pages.

(Continued)

*Primary Examiner* — Cuong Q Nguyen
*Assistant Examiner* — Nishath Yasmeen
(74) *Attorney, Agent, or Firm* — TraskBritt

(57) ABSTRACT

Methods are used to form semiconductor devices that include an integrated circuit and a microelectromechanical system (MEMS) device operatively coupled with the integrated circuit. At least a portion of an integrated circuit may be fabricated on a surface of a substrate, and a MEMS device may be formed over the at least a portion of the integrated circuit. The MEMS device may be operatively coupled with the integrated circuit. Semiconductor structures and electronic devices including such structures are formed using such methods.

7 Claims, 13 Drawing Sheets

(51) Int. Cl.
*H03H 9/10* (2006.01)
*B81B 7/00* (2006.01)

(52) U.S. Cl.
CPC ....... *H03H 9/10* (2013.01); *B81B 2201/0271* (2013.01); *B81B 2207/015* (2013.01); *B81C 2203/0735* (2013.01); *B81C 2203/0792* (2013.01)

(56) References Cited

U.S. PATENT DOCUMENTS

| | | |
|---|---|---|
| 6,756,286 B1 | 6/2004 | Moriceau et al. |
| 6,809,044 B1 | 10/2004 | Aspar et al. |
| 6,946,365 B2 | 9/2005 | Aspar et al. |
| RE39,484 E | 2/2007 | Bruel |
| 7,514,760 B1 | 4/2009 | Quevy |
| 2006/0220189 A1* | 10/2006 | Sakamoto ............ G01D 11/245 257/666 |
| 2007/0048888 A1* | 3/2007 | Christenson .......... B81B 7/0006 438/48 |
| 2009/0194829 A1 | 8/2009 | Chung et al. |
| 2010/0109102 A1 | 5/2010 | Chen et al. |
| 2010/0301703 A1 | 12/2010 | Chen et al. |
| 2010/0315179 A1 | 12/2010 | Schoepf et al. |
| 2011/0187227 A1 | 8/2011 | Chen et al. |
| 2011/0241197 A1 | 10/2011 | Theuss |
| 2011/0273061 A1 | 11/2011 | Thalmayr et al. |
| 2011/0284995 A1 | 11/2011 | Kuypers et al. |
| 2012/0098122 A1 | 4/2012 | Yang |
| 2013/0144542 A1* | 6/2013 | Ernst .................. B81C 1/00238 702/23 |

FOREIGN PATENT DOCUMENTS

| | | |
|---|---|---|
| CN | 102398888 A | 4/2012 |
| CN | 102593220 A | 7/2012 |
| WO | 2011154363 A2 | 12/2011 |
| WO | WO2011154363 * | 12/2011 ......... B81C 1/00238 |

OTHER PUBLICATIONS

International Written Opinion for International Application No. PCT.IB2013/001488 dated Nov. 4, 2013, 6 pages.

Chinese Office Action and Search Report in Chinese Application No. 201380040649.X, dated Oct. 23, 2015, 14 pages.

* cited by examiner

METHODS OF FORMING SEMICONDUCTOR STRUCTURES INCLUDING MEMS DEVICES AND INTEGRATED CIRCUITS ON COMMON SIDES OF SUBSTRATES, AND RELATED STRUCTURES AND DEVICES

CROSS-REFERENCE TO RELATED APPLICATIONS

This application is a national phase entry under 35 U.S.C. §371 of International Patent Application PCT/IB2013/001488, filed Jul. 8, 2013, designating the United States of America and published in English as International Patent Publication WO 2014/020388 A1 on Feb. 6, 2014, which claims the benefit under Article 8 of the Patent Cooperation Treaty and under 35 U.S.C. §119(e) to U.S. Provisional Patent Application Ser. No. 61/677,808, filed Jul. 31, 2012, the disclosure of each of which is hereby incorporated herein in its entirety by this reference.

TECHNICAL FIELD

The present disclosure relates to methods of manufacturing semiconductor structures that include one or more microelectromechanical system (MEMS) devices and conductive vias therein, and to semiconductor structures fabricated using such methods.

BACKGROUND

Semiconductor structures are structures that are used or formed in the fabrication of semiconductor devices. Semiconductor devices include, for example, electronic signal processors, electronic memory devices, photoactive devices, and microelectromechanical system (MEMS) devices. Such structures and materials often include one or more semiconductor materials (e.g., silicon, germanium, a III-V semiconductor material, etc.), and may include at least a portion of an integrated circuit.

MEMS devices are small devices that have both physically active features and electrically active features. The active features of MEMS devices may have micro-scale and/or nano-scale features. For example, MEMS devices may have active features having cross-sectional dimensions of about 100 µm or less.

MEMS devices often comprise a transducer that converts electrical energy in the form of, for example, a voltage or current into kinetic energy (physical energy) in the form of, for example, mechanical deflection or vibrations, or to convert kinetic energy into electrical energy. For example, MEMS devices include resonators that generate resonant mechanical vibrations responsive to an applied electrical signal. MEMS devices also include sensors that are used to sense physical phenomena (e.g., deflection, pressure, vibrations, etc.), by sensing variations in an electrical signal caused by the physical phenomena. Some MEMS devices may be characterized as both resonators and sensors.

Many types of MEMS resonators are known in the art and include, for example, plate acoustic wave resonators, flexural mode resonators, bulk acoustic wave (BAW) resonators, surface acoustic wave (SAW) resonators, and film bulk acoustic resonators (FBARs).

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of forming semiconductor devices that include an integrated circuit and a MEMS device operatively coupled with the integrated circuit. In accordance with such methods, at least a portion of an integrated circuit is fabricated on a first major surface of a substrate, and a MEMS device is formed over the at least a portion of the integrated circuit on a side thereof opposite a first major surface of the substrate. The MEMS device is operatively coupled with the integrated circuit.

In additional embodiments, the present disclosure includes semiconductor structures having at least a portion of an integrated circuit formed on a first major surface of a substrate, and a MEMS device comprising a transducer disposed over the at least a portion of the integrated circuit and the major surface of the substrate.

In yet further embodiments, the present disclosure includes electronic devices that include a substrate having an active surface and an opposing back surface, active components of an integrated circuit on the active surface of the substrate, and a MEMS transducer over the active components of the integrated circuit on a side thereof opposite the active surface of the substrate. The devices further include at least one conductive via electrically coupling the MEMS transducer to an active component of the integrated circuit on the active surface of the substrate.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIG. 1 is a simplified cross-sectional view illustrating a substrate;

FIG. 2 illustrates electrically conductive vias extending through the substrate of FIG. 1 from a first major surface of the substrate to a second major surface of the substrate;

FIG. 3 illustrates transistors formed at the first major surface of the substrate;

FIG. 4 illustrates conductive features fabricated over the transistors of FIG. 3 and communicating electrically with the transistors and the electrically conductive vias;

FIG. 5 illustrates a dielectric material over the active layers of transistors and conductive features of the structure of FIG. 4;

FIG. 6 illustrates a transducer cavity recess formed in a major surface of the dielectric material of FIG. 5;

FIG. 7 illustrates a semiconductor-on-insulator-type structure bonded to the exposed major surface of the dielectric material of the structure of FIG. 6;

FIG. 8 illustrates a relatively thin layer of material transferred from the semiconductor-on-insulator-type structure to the dielectric material over the active layers;

FIG. 9 illustrates conductive vias formed through the transferred layer of material for electrically coupling a MEMS device to be formed using a portion of the transferred layer of material to conductive features in the active layers;

FIG. 10 illustrates a structure formed by processing the transferred thin layer of material shown in FIG. 9 to form a resonator comprising a portion of the thin layer of material;

FIG. 11 illustrates a cap structure bonded to the thin layer of material and extending over the resonator comprising a portion of the thin layer of material and over the first major surface of the substrate;

FIG. 12 illustrates the structure of FIG. 11 structurally and electrically coupled to a higher level substrate using electrically conductive contacts formed over the second major surface of the substrate and in electrical contact with the conductive vias extending through the substrate;

FIG. 13 illustrates a structure like that of FIG. 9, but further including another electrical contact structure for use in a wire bonding process, the electrical contact structure extending through the transferred layer of material to a conductive feature in the active layers;

FIG. 14 illustrates a structure formed by processing the transferred thin layer of material shown in FIG. 13 to form a resonator comprising a portion of the thin layer of material;

FIG. 15 illustrates a cap structure bonded to the thin layer of material and extending over the resonator comprising a portion of the thin layer of material and over the first major surface of the substrate;

FIG. 16 illustrates the structure of FIG. 15 structurally attached to a higher level substrate and electrically coupled to a conductive feature of the higher level substrate using a wire bond;

FIG. 17 illustrates a structure like that of FIG. 6, which includes a transducer cavity recess formed in a major surface of a dielectric material overlying active layers of an integrated circuit on an active surface of a substrate;

FIG. 18 illustrates conductive vias formed through the dielectric material to conductive features in the active layers;

FIG. 19 illustrates a transducer cavity recess formed in a major surface of another substrate;

FIG. 20 illustrates a semiconductor-on-insulator-type structure bonded to the major surface of the substrate of FIG. 19;

FIG. 21 illustrates a relatively thin layer of material transferred from the semiconductor-on-insulator-type structure of FIG. 20 to the major surface of the substrate of FIG. 20 by removing a relatively thick volume of bulk material from the semiconductor-on-insulator-type structure after forming the bonded structure of FIG. 20;

FIG. 22 illustrates conductive vias formed through the transferred layer of material and through the substrate of FIG. 21;

FIG. 23 illustrates a structure formed by processing the transferred thin layer of material shown in FIG. 22 to form a resonator comprising a portion of the thin layer of material;

FIG. 24 illustrates the structure of FIG. 23 structurally and electrically coupled with the structure of FIG. 18, such that the resonator of the structure of FIG. 23 is electrically coupled with the active circuit of the structure of FIG. 18; and FIG. 25 illustrates the structure of FIG. 24 structurally and electrically coupled to a higher level substrate.

DETAILED DESCRIPTION

The illustrations presented herein are not meant to be actual views of any particular semiconductor material, structure, or device, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

The present disclosure includes methods that may be used to form semiconductor devices that include at least a portion of an integrated circuit and a MEMS device. The integrated circuit is electrically interconnected with the MEMS device. At least a portion of the MEMS device and the integrated circuit may be integrally formed over an active surface of a substrate. Examples of such methods are disclosed in further detail below.

FIGS. 1 through 12 illustrate a non-limiting example of a method of forming a semiconductor device that includes the formation of at least a portion of an integrated circuit on a substrate, and subsequently integrally forming at least a portion of a MEMS device over the integrated circuit and the active surface of the substrate.

Figure 1:
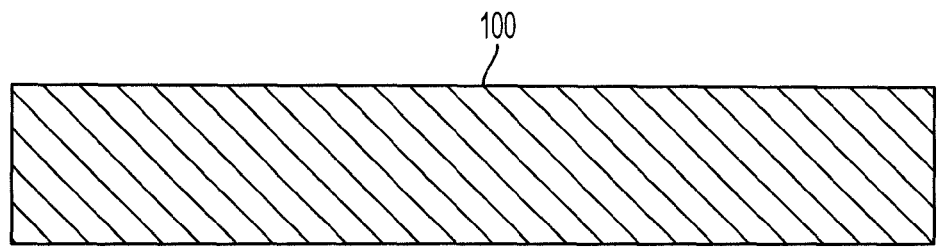
FIGS. 1 through 12 illustrate an example of a method that may be used to form a semiconductor device comprising at least a portion of an integrated circuit and a MEMS device operatively coupled with the integrated circuit, wherein at least a portion of the MEMS device is integrally fabricated over an active surface of the substrate on which the integrated circuit is also formed.

FIG. 1 is a simplified cross-sectional view of a substrate 100. The substrate 100 may comprise what is referred to in the art as a "die" or a "wafer," and may be generally planar. The substrate 100 may comprise any of a number of materials conventionally used for substrates in the fabrication of integrated circuits. As non-limiting examples, the substrate 100 may comprise an oxide (e.g., aluminum oxide, zirconium oxide, silicon oxide, etc.), a nitride (e.g., silicon nitride), a carbide (e.g., silicon carbide), or a semiconductor material (e.g., silicon, germanium, a III-V semiconductor material, etc.). In some embodiments, the substrate 100 may comprise a crystalline material (e.g., polycrystalline or monocrystalline material). Further, the substrate 100 may be at least substantially comprised by a single, generally homogeneous material, or the substrate 100 may comprise a multi-layer structure.

Figure 2:
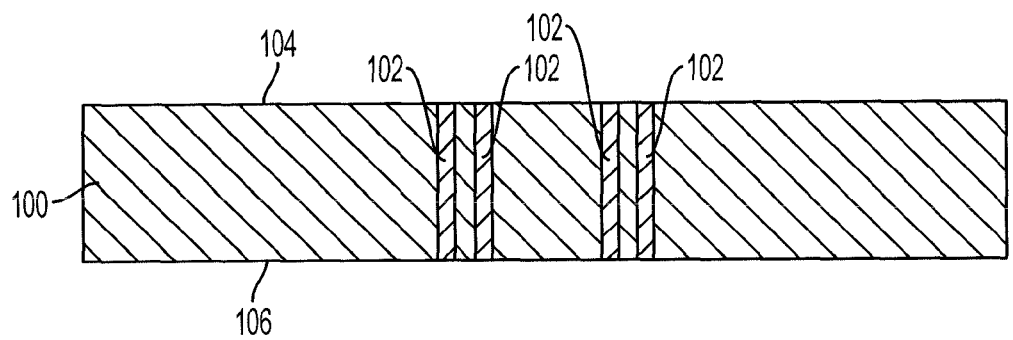

Referring to FIG. 2, one or more electrically conductive vias 102 may be formed in the substrate 100. The one or more electrically conductive vias 102 may extend at least partially through the substrate 100 from a first major surface 104 of the substrate 100 to a second major surface 106 of the substrate 100 on an opposing side of the substrate 100. FIG.

2 illustrates four (4) conductive vias 102, although the substrate 100 may in fact include any number of conductive vias 102. The conductive vias 102 may be formed using processes known in the art. For example, via holes may be formed into the substrate 100 using, for example, a photolithographic masking and etching process. In such embodiments, a mask layer may be deposited over the first major surface 104 of the substrate 100 and selectively patterned so as to form apertures through the mask layer at the locations at which it is desired to etch into the substrate 100 to form the via holes. After forming the patterned mask layer, the regions of the substrate 100 that are exposed through the patterned mask layer may be etched using, for example, a dry reactive ion etching process to form the via holes in the substrate 100. After the etching process, the patterned mask layer may be removed, and the via holes may be filled with electrically conductive material to form the conductive vias 102. The electrically conductive material may comprise, for example, doped polysilicon. In some embodiments, the conductive material may comprise a multi-layer structure including multiple layers of different conductive materials. The conductive material may be deposited within the via holes using one or more of a deposition process (e.g., a physical vapor deposition process (PVD) or a chemical vapor deposition (CVD) process), an electroless plating process, and an electrolytic plating process.

As shown in FIG. 2, the conductive vias 102 may extend entirely through the substrate 100 in some embodiments. In other embodiments, the conductive vias 102 may extend only partially through the substrate 100 when initially formed, and the substrate 100 then may be thinned until the conductive vias 102 are exposed at both the first major surface 104 and the second major surface 106 and extend entirely through the substrate 100. Thus, the conductive vias 102 may comprise what are often referred to in the art as "through-wafer vias" (TWVs) or, in embodiments in which the substrate 100 comprises silicon, "through-silicon vias" (TSVs).

In some embodiments, the substrate 100 may have an average layer thickness between the first major surface 104 and the second major surface 106 (the vertical dimension from the perspective of FIG. 2) of about two hundred fifty microns (250 μm) or more, about five hundred microns (500 μm) or more, or even about seven hundred fifty microns (750 μm) or more. The conductive vias 102 may have an average cross-sectional dimension (e.g., average diameter) such that an aspect ratio (the aspect ratio being the ratio of length to average cross-sectional dimension) of the conductive vias 102 is about twenty-five (25) or less, about ten (10) or less, or even about five (5) or less. It may be difficult to fabricate conductive vias 102 that have a high aspect ratio. Thus, it may be desirable to form the conductive vias 102 partially through the substrate 100, and then to subsequently thin at least a portion of the substrate 100 until the conductive vias 102 are exposed at both the first major surface 104 and the second major surface 106 of the substrate 100 as mentioned above.

Figure 3:
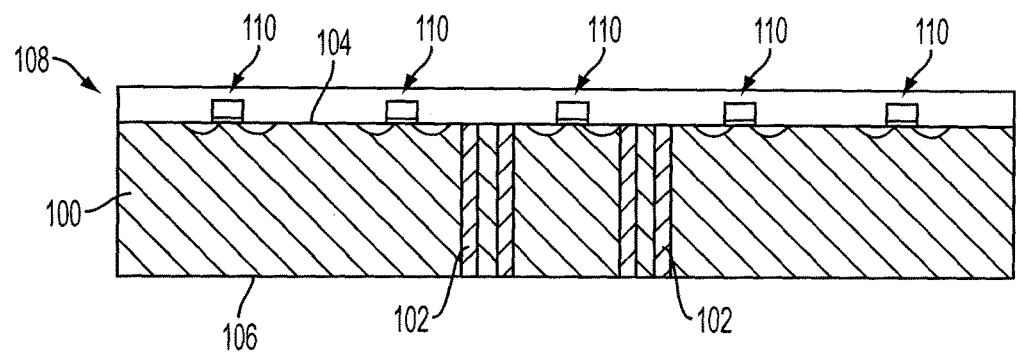

At least a portion of an integrated circuit may be fabricated on the first major surface 104 of the substrate 100. For example, FIG. 3 illustrates an active layer 108 foiled on the first major surface 104 that includes a plurality of transistors 110. Thus, the first major surface 104 of the substrate 100 may comprise what is often referred to in the art as an "active surface" of the substrate 100, and the second major surface 106 of the substrate 100 may comprise what is often referred to in the art as a "back surface" of the substrate 100. The transistors 110 may be formed in, on, and/or over the first major surface 104 of the substrate 100 using processes known in the art. As a non-limiting example, the transistors 110 may comprise metal oxide semiconductor field effect transistors (MOSFETs), and may embody complementary metal oxide semiconductor (CMOS) technology. The processes often employed in the art to fabricate such transistors 110 are often referred to in the art as "front-end-of-line" (FEOL) processes, and often involve processes carried out at temperatures greater than four hundred degrees Celsius (400° C.). Thus, in such embodiments, the conductive material used to form the conductive vias 102, which are fabricated prior to forming the active layer 108, may comprise a material that is stable through the temperature ranges to which the structure will be subjected during the FEOL processes used to form the transistors 110. For example, the conductive material used to form the conductive vias 102 may comprise doped polysilicon in such embodiments.

Figure 4:
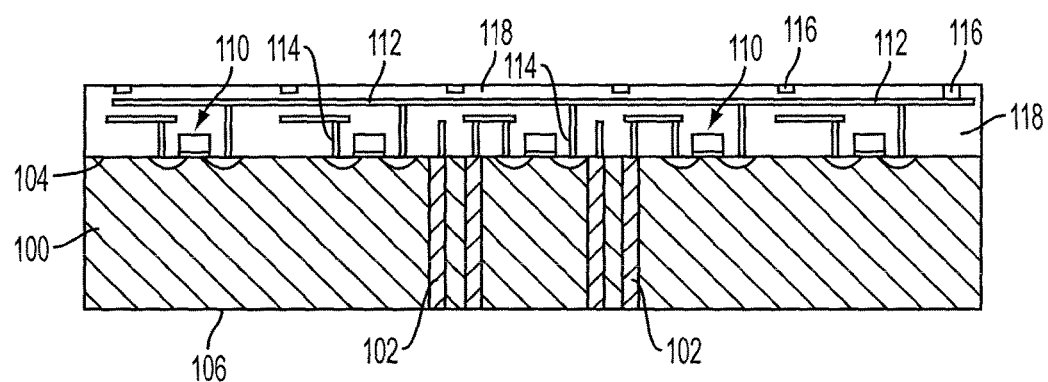

Referring to FIG. 4, after forming the transistors 110, one or more additional layers of electrically conductive features used to electrically interconnect various features of the transistors 110 (e.g., sources, drains, and gates of the transistors 110) may be formed over the transistors 110 on a side thereof opposite the first major surface 104 of the substrate 100. The conductive features may comprise one or more of laterally extending conductive lines 112 (e.g., traces), vertically extending conductive vias 114, and electrical contact pads 116. The conductive features may comprise electrically conductive material regions (e.g., copper, aluminum, tungsten, etc.) that are at least partially embedded in a dielectric material 118. The one or more layers of conductive features and surrounding dielectric material 118 may be formed in a layer-by-layer lithographic process over the transistors 110. In such processes, layers of dielectric material and layers of conductive material may be deposited and selectively patterned in an alternating manner to form the various conductive features and the dielectric material 118. The processes often employed in the art to fabricate these electrically conductive features are often referred to in the art as "back-end-of-line" (BEOL) processes, and often involve processes carried out at temperatures of about four hundred degrees Celsius (400° C.) or less (although, in some embodiments, one or more initial layers of metal deposited as part of the BEOL processes may comprise tungsten, which may be deposited at temperatures up to about nine hundred degrees Celsius (900° C.)).

One or more of the conductive features formed over the transistors 110 (e.g., one or more of the conductive lines 112, conductive vias 114, and electrical contact pads 116) may be electrically coupled with one or more of the conductive vias 102. Stated another way, a continuous electrical pathway may be provided between at least one conductive via 102 and one or more of the conductive features.

The transistors 110 and the conductive features formed over the transistors 110 (e.g., one or more of the conductive lines 112, conductive vias 114, and electrical contact pads 116) may form at least a portion of an integrated circuit. After the FEOL processing and BEOL processing used to form the active layers of the integrated circuit as described above, a MEMS device may be formed over the integrated circuit on a side thereof opposite the first major surface 104 of the substrate 100, and the MEMS device may be operatively coupled with the integrated circuit, as discussed below.

In additional embodiments, the conductive vias 102 may be fabricated after formation of the transistors 110 instead of prior to formation of the transistors 110. In other words, the transistors 110 may be fabricated on the substrate 100, and the conductive vias 102 then may be fabricated through the active layers comprising the transistors 110 and partially through the substrate 100. Thus, the conductive vias 102 may be fabricated prior to standard FEOL processes, after standard FEOL processes and prior to standard BEOL processes, or after BEOL processes. As previously mentioned, one or more initial layers of metal deposited as part of the BEOL processes may comprise tungsten, which may be deposited at temperatures up to about nine hundred degrees Celsius (900° C.)). In some embodiments, the conductive vias 102 may be fabricated after depositing such initial layers of tungsten in BEOL processing, but prior to completing the BEOL processing.

In embodiments in which the conductive vias 102 are fabricated after the FEOL processes, the conductive vias 102 may comprise conductive materials that are not necessarily stable at temperatures higher than 900° C., or even higher than 400° C., as subsequent processing may be limited to lower temperatures due to the presence of the BEOL features. Thus, the conductive vias 102 may comprise a metal, a metal alloy, or doped polysilicon in such embodiments.

Figure 5:
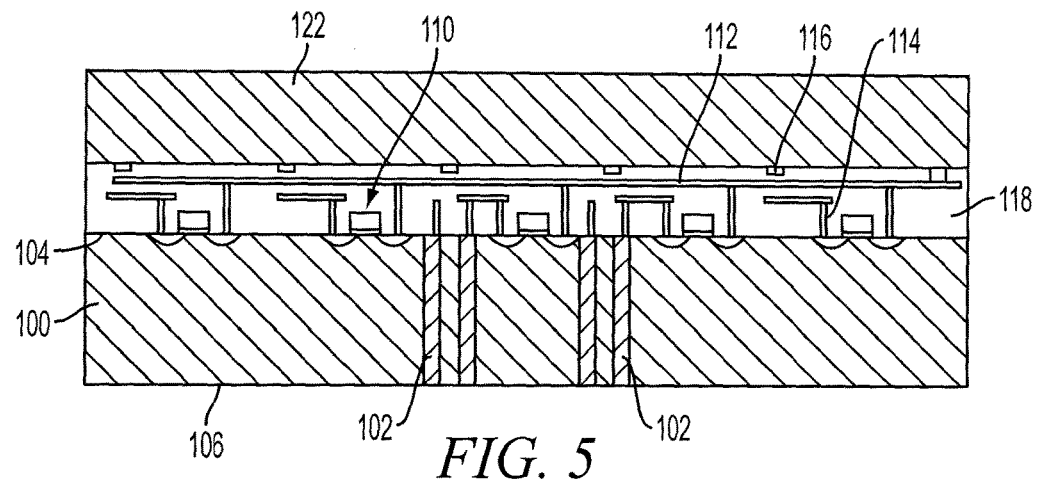

Referring to FIG. 5, a layer of dielectric material 122 may be provided over the active layers of the integrated circuit, which include the transistors 110, the conductive lines 112, conductive vias 114, and electrical contact pads 116, and the dielectric material 118. The dielectric material 122 may comprise, for example, an oxide (e.g., aluminum oxide, zirconium oxide, silicon oxide, etc.) or a nitride (e.g., silicon nitride). The dielectric material 122 may be deposited over the active layers using any of a number of known processes for depositing dielectric material including, for example, spin-on processes, chemical vapor deposition (CVD) processes, etc. The layer of dielectric material 122 may have an average layer thickness sufficient to form a transducer cavity recess therein, as discussed in further detail below. As a non-limiting example, the layer of dielectric material 122 may have an average layer thickness between about ten microns (10 μm) and about five hundred microns (500 μm) or more. It may be desirable to planarize the exposed surface of the dielectric material 122 after depositing the dielectric material 122 using, for example, a chemical-mechanical polishing (CMP) process.

Figure 6:
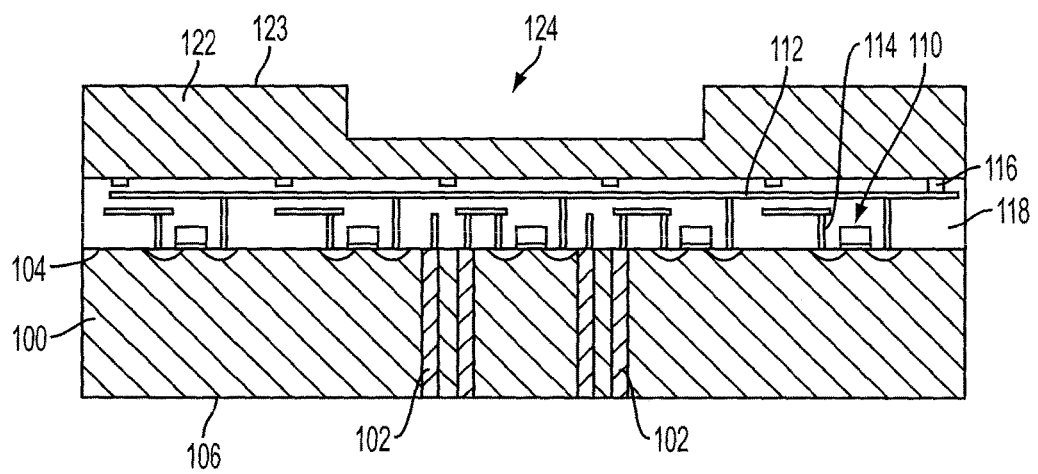

Referring to FIG. 6, at least one transducer cavity recess 124 may be formed in an exposed major surface 123 of the dielectric material 122. The transducer cavity recess 124 is ultimately used to form at least a portion of a transducer cavity in which at least a portion of a transducer of a MEMS device is to be disposed. The transducer cavity recess 124 may have any desirable size and shape, and the desired size and shape may be at least partially a function of the type of transducer to be formed. As non-limiting examples, the transducer cavity recess 124 may extend an average depth into the surface 123 of the dielectric material 122 (the vertical dimension from the perspective of FIG. 6) that is at least about one micron (1 μm), at least about ten microns (10 μm), at least about one hundred microns (100 μm), or even five hundred microns (500 μm) or more. Additionally, the transducer cavity recess 124 may have an average width parallel to the surface 123 of the dielectric material 122 (the horizontal dimension from the perspective of FIG. 6) of at least about fifty microns (50 μm), at least about five hundred microns (500 μm), at least about one thousand microns (1,000 μm), or even greater. In embodiments in which the transducer to be formed comprises a resonator, the frequencies at which the resonator is to resonate may be at least partially a function of the size and shape of the transducer cavity recess 124, and the size and shape of the transducer cavity recess 124 may be designed and selected to provide desirable resonant frequencies.

The transducer cavity recess 124 may be formed in the major surface 123 of the dielectric material 122 using, for example, a photolithographic masking and etching process. In such embodiments, a mask layer may be deposited over the major surface 123 of the dielectric material 122 and selectively patterned so as to form an aperture through the mask layer at the location at which it is desired to etch into the dielectric material 122 to form the transducer cavity recess 124. After forming the patterned mask layer, the regions of the dielectric material 122 that are exposed through the patterned mask layer may be etched using, for example, a dry reactive ion etching process or a wet chemical etching process to form the transducer cavity recess 124. After the etching process, the patterned mask layer may be removed.

As one non-limiting example, in embodiments in which the dielectric material 122 comprises silicon oxide ($SiO_2$), the transducer cavity recess 124 may be etched in the silicon oxide using a wet chemical etching process in which a solution comprising between about 1% and about 50% by volume hydrofluoric acid (HF), and between about 50% and about 99% by volume water ($H_2O$). The solution may further include ammonium fluoride $NH_4F$ or nitric acid $HNO_3$ in some embodiments. The etching process may be carried out at a temperature of between about twenty degrees Celsius (20° C.) and about one hundred degrees Celsius (100° C.) for a sufficient time to form a transducer cavity recess 124 having desirable dimensions.

Figure 7:
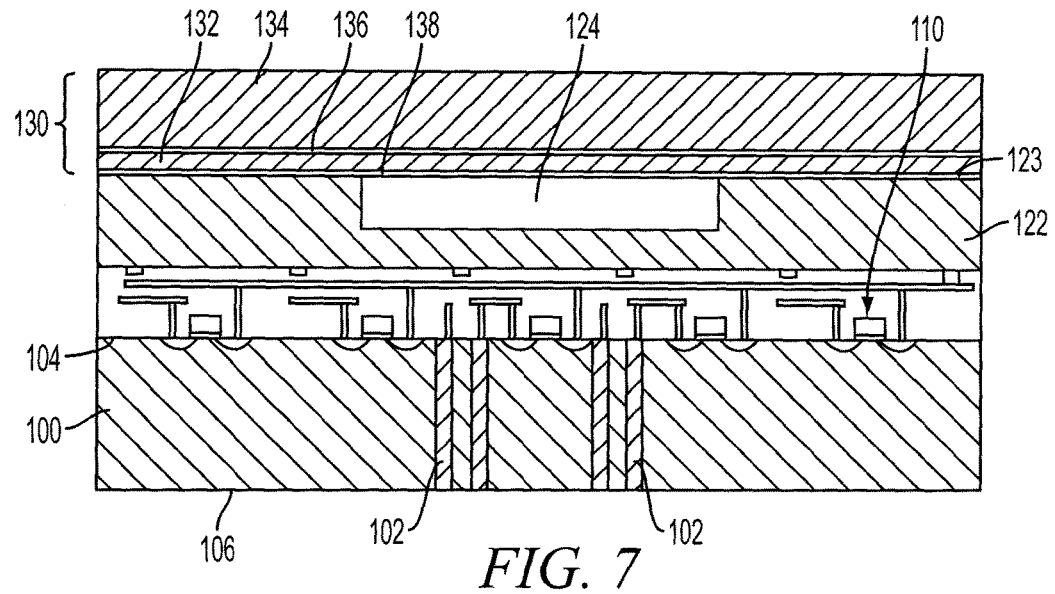

After forming the transducer cavity recess 124, a transducer may be formed over the transducer cavity recess 124. Referring to FIG. 7, as a non-limiting example of a method that may be used to form such a transducer, a semiconductor-on-insulator-type (SOI-type) structure 130 may be bonded over the major surface 123 of the dielectric material 122 and over the transducer cavity recess 124. The SOI-type structure 130 includes a relatively thin layer of material 132 bonded to a relatively thick volume of bulk material 134 with an intermediate material 136 between the layer of material 132 and the bulk material 134. The layer of material 132 is thin relative to the bulk material 134, and the bulk material 134 is thick relative to the layer of material 132. The intermediate material 136 may be approximately equal in thickness to the layer of material 132, or it may be thinner than the layer of material 132.

The SOI-type structure 130 is a structure having a structural configuration like that of conventional semiconductor-on-insulator (SOI) structures, although the layer of material 132 may or may not comprise a semiconductor material, and the intermediate material 136 may or may not comprise an insulator material. A portion of the layer of material 132 is ultimately used to form at least a portion of a transducer (e.g., a resonator or a sensor), and may comprise, for example, a piezoelectric material, a semiconductor material, a ceramic material, or a metal material. Piezoelectric materials include, for example, quartz (crystalline $SiO_2$), $AlPO_4$, $GaPO_4$, $BaTiO_3$, lead zirconate titanate (PZT), zinc oxide, and aluminum nitride. The layer of material 132 may comprise any of these piezoelectric materials in some embodiments. In other embodiments, the layer of material 132 may comprise a semiconductor material such as silicon, germanium, or a III-V semiconductor material (e.g., GaN, AlN, InN, GaP, AlP, InP, etc.).

The bulk material 134 may comprise any of a number of materials conventionally used for SOI substrates. Such materials include, for example, ceramics such as oxides (e.g., aluminum oxide, zirconium oxide, silicon oxide, etc.), nitrides (e.g., silicon nitride), and carbides (e.g., silicon carbide), as well as semiconductor materials (e.g., silicon, germanium, a III-V semiconductor material, etc.). The bulk material 134 may comprise an amorphous material or a crystalline material (e.g., polycrystalline or monocrystalline material). The intermediate material 136 may comprise a dielectric material, a metal material, or a semiconductor material. As a non-limiting example, the intermediate material 136 may comprise an oxide such as silicon dioxide ($SiO_2$).

The layer of material 132 may have any desirable average layer thickness. As non-limiting examples, the layer of material 132 may have an average layer thickness between about five nanometers (5 nm) and about five hundred microns (500 µm), between about five nanometers (5 nm) and about one hundred microns (100 pin), or even between about five nanometers (5 nm) and about ten microns (10 µm). If the MEMS device to be fabricated comprises a resonator, the resonant frequencies of the resonator to be formed may be affected by the thickness of the layer of material 132, and the thickness of the layer of material 132 and the ultimate resonator formed from a portion of the layer of material 132 may be selected accordingly.

As shown in FIG. 7, the SOI-type structure 130 is bonded to the major surface 123 of the dielectric material 122 such that the layer of material 132 is disposed between the dielectric material 122 and the bulk material 134. Stated another way, the layer of material 132 may be bonded to the major surface 123 of the dielectric material 122. In some embodiments, the layer of material 132 may be bonded to the major surface 123 of the dielectric material 122 using a direct bonding process without using any adhesive therebetween.

The layer of material 132 may be bonded to the major surface 123 of the dielectric material 122 using a direct bonding process in which the layer of material 132 is directly bonded to the surface 106 by providing direct atomic bonds therebetween. In other words, the layer of material 132 may be directly bonded to the substrate 100 without using an adhesive between the layer of material 132 and the dielectric material 122. The nature of the atomic bonds between the layer of material 132 and the dielectric material 122 will depend upon the material compositions at the surfaces of each of the layer of material 132 and the dielectric material 122. In some embodiments, the dielectric material 122 may comprise silicon dioxide ($SiO_2$), and silicon dioxide may be provided on the exposed major surface of the layer of material 132. Thus, in accordance with such embodiments, direct atomic bonds may be provided between silicon dioxide on the exposed major surface of the layer of material 132 and on the major surface 123 of the dielectric material 122. Stated another way, the bonding surface of the layer of material 132 may comprise an oxide material (e.g., silicon dioxide ($SiO_2$)) and the bonding surface of the dielectric material 122 may be at least substantially comprised of the same oxide material (e.g., silicon dioxide ($SiO_2$)). In such embodiments, a silicon oxide-to-silicon oxide surface direct-bonding process may be used to bond the bonding surface of the layer of material 132 to the bonding surface of the dielectric material 122. In such embodiments, as shown in FIG. 7, a bonding material 138 (e.g., a layer of oxide such as silicon dioxide) may be disposed between the layer of material 132 and the dielectric material 122 at a bonding interface therebetween. The bonding material 138 may have an average thickness of, for example, between about one nanometer (1 nm) and about one micron (1 µm).

In additional embodiments, the bonding surface of the layer of material 132 may comprise a semiconductor material (e.g., silicon), and the bonding surface of the dielectric material 122 may be at least substantially comprised of the same semiconductor material (e.g., un-doped silicon). In such embodiments, a silicon-to-silicon surface direct-bonding process may be used to bond the bonding surface of the layer of material 132 to a bonding surface of the dielectric material 122.

In some embodiments, the direct bond between the bonding surface of the layer of material 132 and the bonding surface of the dielectric material 122 may be established by forming each of the bonding surface of the layer of material 132 and the bonding surface of the dielectric material 122 to have relatively smooth surfaces, and subsequently abutting the bonding surfaces together and initiating propagation of a bonding wave therebetween.

For example, each of the bonding surface of the layer of material 132 and the bonding surface of the dielectric material 122 may be formed to have a root mean square surface roughness ($R_{RMS}$) of about two nanometers (2.0 nm) or less, about one nanometer (1.0 nm) or less, or even about one-quarter of a nanometer (0.25 nm) or less. Each of the bonding surface of the layer of material 132 and the bonding surface of the dielectric material 122 may be smoothed using at least one of a mechanical polishing process and a chemical etching process. For example, a chemical-mechanical polishing (CMP) process may be used to planarize and/or reduce the surface roughness of each of the bonding surface of the layer of material 132 and the bonding surface of the dielectric material 122.

After smoothing the bonding surfaces, the bonding surfaces optionally may be cleaned and/or activated using processes known in the art. Such an activation process may be used to alter the surface chemistry at the bonding surfaces in a manner that facilitates the bonding process and/or results in the formation of a stronger bond.

The bonding surfaces may be brought into direct physical contact with one another, and pressure may be applied in a localized area across the bonding interface. Inter-atomic bonds may be initiated in the vicinity of the localized pressure area, and a bonding wave may propagate at a rapid rate across the interface between the bonding surfaces.

Optionally, an annealing process may be used to strengthen the bond. Such an annealing process may comprise heating the layer of material 132 and the dielectric material 122 in a furnace at a temperature of between about one hundred degrees Celsius (100° C.) and about four hundred degrees Celsius (400° C.) for a time of between about two minutes (2 mins.) and about fifteen hours (15 hrs.).

In some embodiments, the transducer cavity recesses 124 may be hermetically sealed between the layer of material 132 of the SOI-type structure 130 and the dielectric material 122 during the direct bonding process. In some embodiments, the layer of material 132 of the SOI-type structure 130 may be bonded to the dielectric material 122 under vacuum, such that a vacuum is permanently sealed within the transducer cavity recesses 124. In other embodiments, the layer of material 132 of the SOI-type structure 130 may be bonded to the dielectric material 122 in an inert gas environment, such that inert gas is permanently sealed within the transducer cavity recesses 124. In yet further embodiments, the layer of material 132 of the SOI-type structure 130 may be bonded to the dielectric material 122 under ambient conditions, such that air is permanently sealed within the transducer cavity recesses 124.

Figure 8:
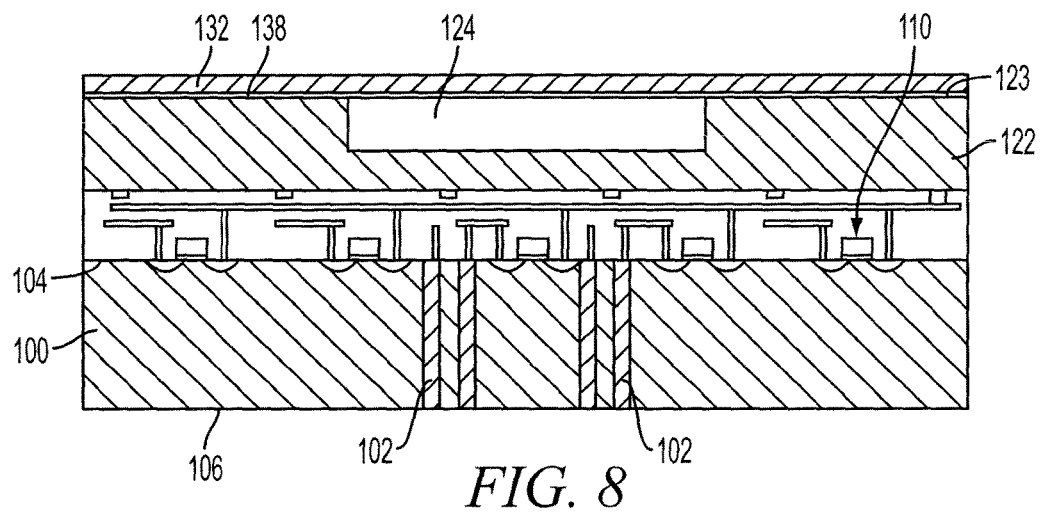

Referring to FIG. 8, after bonding the SOI-type structure 130 (FIG. 7) to the major surface 123 of the dielectric material 122, the bulk material 134 of the SOI-type structure 130 may be removed leaving the layer of material 132 (and optionally the intermediate material 136 (see FIG. 7)) behind and bonded to the substrate 100. In some embodiments, the bulk material 134 of the SOI-type structure 130 may be removed by fracturing the SOI-type structure 130 (FIG. 7) along the intermediate material 136. In other embodiments, one or more of an etching process, a grinding process, and a polishing process (e.g., a chemical-mechanical polishing (CMP) process) may be used to remove the bulk material 134 (and optionally the intermediate material 136).

In additional embodiments, the structure of FIG. 8, which includes the layer of material 132 (and optionally the intermediate material 136), may be formed using what is referred to in the art as a SMART CUT® process. Such processes are described in, for example, U.S. Pat. No. RE 39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the disclosures of which are incorporated herein in their entireties by this reference. Briefly, in such methods, ions may be implanted into a wafer of bulk material (which may not comprise an SOI-type structure 130) along an ion implant plane to define a plane of weakness within the wafer. The wafer then may be attached to the major surface 123 of the dielectric material 122 as previously described herein in relation to the bonding of the SOI-type structure 130 to the dielectric material 122 with reference to FIG. 7. The wafer then may be cleaved or otherwise fractured along the ion implant plane to separate the layer of material 132 from the wafer, leaving the layer of material 132 bonded to the major surface 123 of the dielectric material 122. The bonding and fracturing process may be performed at a temperature of about 400° C. or less. The fractured surface of the layer of material 132 may be smoothed using a chemical-mechanical polishing (CMP) process after the fracturing process.

In yet further embodiments, the structure of FIG. 8, which includes the layer of material 132 (and optionally the intermediate material 136), may be formed by bonding a wafer of bulk material (which may not comprise an SOI-type structure 130) to the major surface 123 of the dielectric material 122 using, for example, a direct bonding process as previously described herein in relation to the bonding of the SOI-type structure 130 to the dielectric material 122 with reference to FIG. 7. The wafer then may be thinned from a side thereof opposite the dielectric material 122 to form the layer of material 132. The thinning process may comprise at least one of a grinding process, an etching process, and a polishing process (e.g., a chemical-mechanical polishing (CMP) process).

Figure 9:
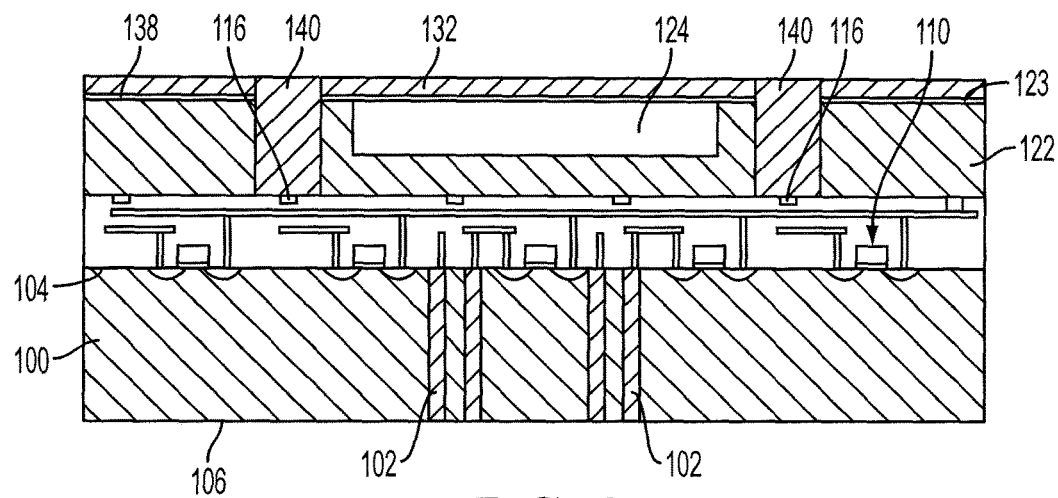

Referring to FIG. 9, after transferring the layer of material 132 from the SOI-type structure 130 to the major surface 123 of the dielectric material 122, conductive vias 140 may be formed that extend through the layer of material 132 and through the dielectric material 122 to conductive features of the integrated circuit fabricated over the first major surface 104 of the substrate 100, such as to contact pads 116. One or more of the conductive vias 140 may be used to electrically couple a MEMS device being fabricated using a portion of the layer of material 132 to the integrated circuit.

The conductive vias 140 may be fabricated using processes known in the art. For example, via holes may be formed through the layer of material 132 and through the dielectric material 122 using, for example, a photolithographic masking and etching process. In such embodiments, a mask layer may be deposited over the exposed major surface of the layer of material 132 and selectively patterned so as to form apertures through the mask layer at the locations at which it is desired to etch into the layer of material 132 and the dielectric material 122 to form the via holes. After forming the patterned mask layer, the regions of the layer of material 132 that are exposed through the patterned mask layer (and the underlying regions of the dielectric material 122) may be etched using, for example, a dry reactive ion etching process to form the via holes extending through the layer of material 132 and the dielectric material 122. After the etching process, the patterned mask layer may be removed, and the via holes may be filled with electrically conductive material to form the conductive vias 140. The electrically conductive material may comprise, for example, a metal, a metal alloy, or doped polysilicon. In some embodiments, the conductive material may comprise a multi-layer structure including multiple layers of different conductive materials. The conductive material may be deposited within the via holes using one or more of a deposition process (e.g., a physical vapor deposition process (PVD) or a chemical vapor deposition (CVD) process), an electroless plating process, and an electrolytic plating process.

Figure 10:
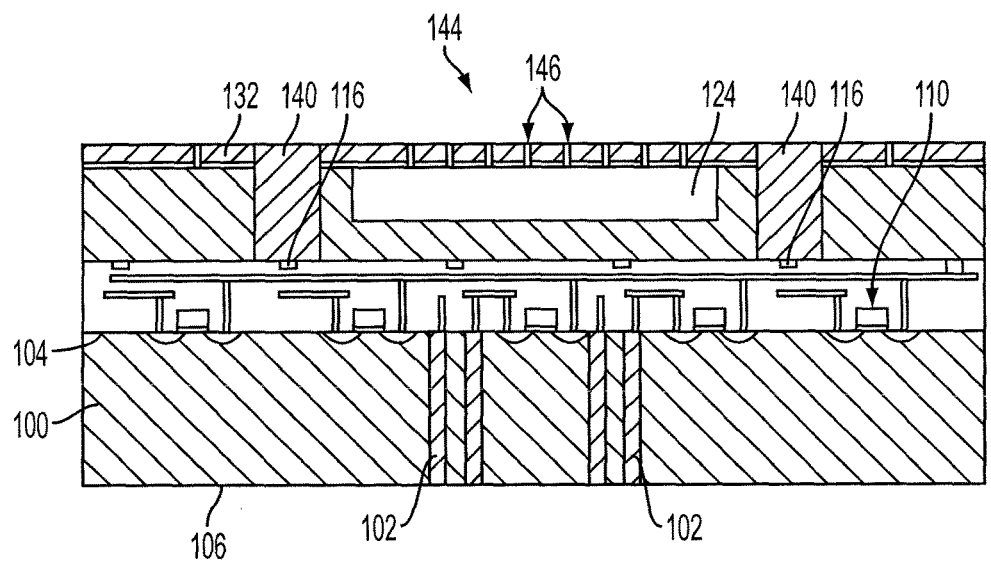

As shown in FIG. 10, a region of the layer of material 132 proximate the transducer cavity recess 124 may be processed to form a transducer 144 over and adjacent the transducer cavity recess 124. By way of example and not limitation, trenches and/or holes 146 may be framed in or through the layer of material 132 proximate the transducer cavity recess 124 to selectively reduce the structural support for a portion of the layer of material 132 to comprise the transducer 144, and/or to electrically isolate regions of the layer of material 132 comprising the transducer 144. The particular structure of the transducer 144 is not critical to embodiments of the disclosure, and various configurations of transducers may be employed. Additional processing may be employed as needed to form a transducer 144 having a desirable configuration and comprising a portion of the layer of material 132. As non-limiting examples, the transducer 144 may comprise a resonator, such as a plate acoustic wave resonator, a flexural mode resonator, a bulk acoustic wave (BAW) resonator, a surface acoustic wave (SAW) resonator, or a film bulk acoustic resonator (FBAR). In other embodiments, the transducer 144 may comprise a sensor configured to electrically sense mechanical deformation of, or vibrations in, a portion of the transducer 144.

As shown in FIG. 10, one or more of the conductive vias 140 may be in physical and electrical contact with conductive features, such as contact pads 116, of the integrated circuit, and also in physical and electrical contact with portions of the layer of material 132 that comprise elements or features of the transducer 144, thus providing electrical interconnection between the transducer 144 and the integrated circuit.

Figure 11:
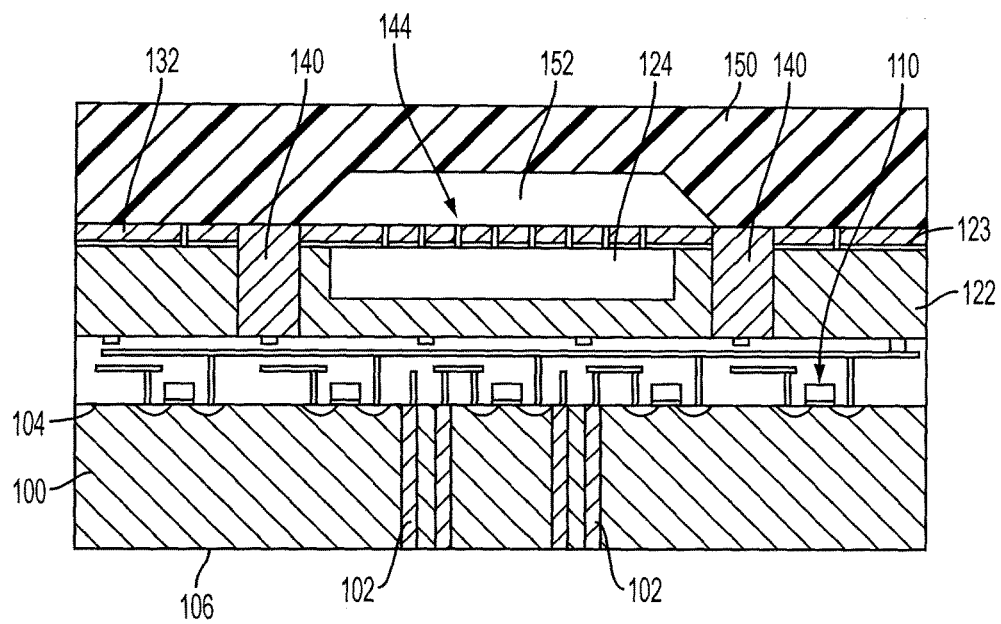

Referring to FIG. 11, a cap structure 150 may be provided over the layer of material 132 and the transducer 144. The cap structure 150 may comprise another transducer cavity recess 152 located and configured to be disposed adjacent the transducer 144 on a side thereof opposite the transducer cavity recess 124 formed in the substrate 100. The transducer cavity recess 152 may be formed in the cap structure 150 prior to bonding the cap structure 150 to the layer of material 132 using processes like those previously discussed in relation to formation of the transducer cavity recess 124.

The cap structure 150 may comprise, for example, a ceramic such as an oxide (e.g., aluminum oxide, zirconium oxide, silicon oxide, etc.), a nitride (e.g., silicon nitride), or a carbide (e.g., silicon carbide). In other embodiments, the cap structure 150 may comprise a semiconductor material (e.g., silicon, germanium, a III-V semiconductor material, etc.) or a metal or metal alloy. Additionally, the material of the cap structure 150 may be amorphous or crystalline (polycrystalline or monocrystalline).

The cap structure 150 may be bonded to the layer of material 132 using, for example, a direct bonding process as previously described with reference to FIG. 7. In other embodiments, the cap structure 150 may be bonded to the layer of material 132 using an adhesive.

The transducer 144 may be hermetically sealed between the cap structure 150 and the dielectric material 122. In some embodiments, the cap structure 150 may be bonded to the layer of material 132 under vacuum, such that a vacuum is permanently sealed within the transducer cavity recesses 124, 152. In other embodiments, the cap structure 150 may be bonded to the layer of material 132 in an inert gas environment, such that inert gas is permanently sealed within the transducer cavity recesses 124, 152. In yet further embodiments, the cap structure 150 may be bonded to the layer of material 132 under ambient conditions, such that air is permanently sealed within the transducer cavity recesses 124, 152.

Figure 12:
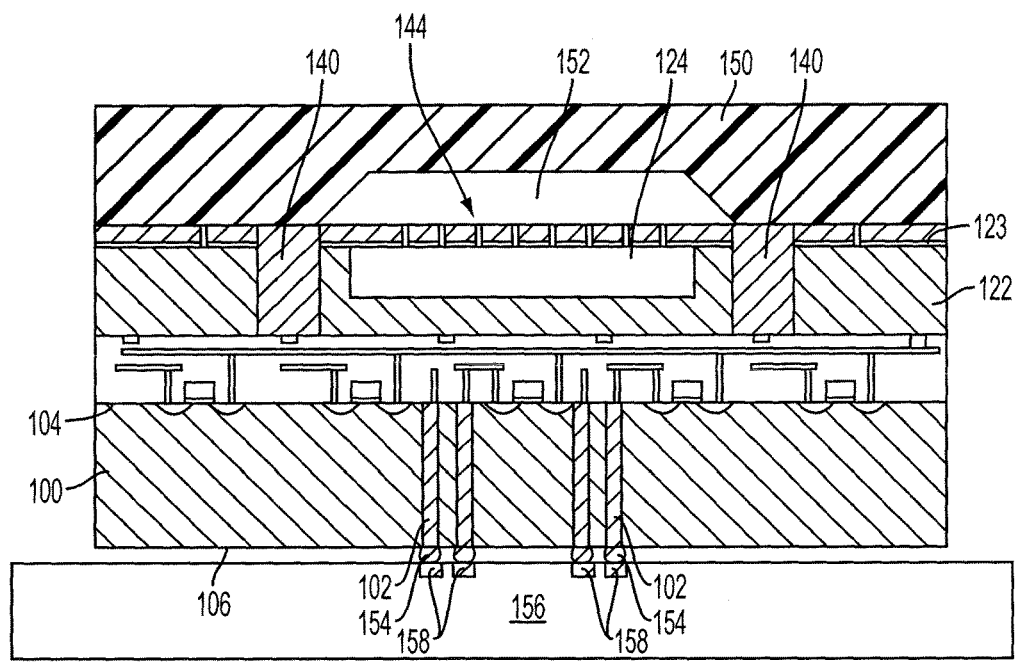

The structure of FIG. 11 includes a transducer 144 and at least a portion of an integrated circuit operatively coupled with the transducer 144. Thus, the structure of FIG. 11 may be configured for attachment to another structure or device for use in a higher level electrical device or system. For example, referring to FIG. 12, bumps or balls 154 of electrically conductive metal or metal alloy optionally may be formed over the second major surface 106 of the substrate 100, and the bumps or balls 154 may be in electrical contact with ends of the conductive vias 102 exposed at the second major surface 106 of the substrate 100. The bumps or balls 154 may be used to structurally and electrically couple the structure of FIG. 11 to another structure or device 156, as shown in FIG. 12. In this configuration, the substrate 100 is disposed between the transducer 144 and the structure or device 156.

By way of example and not limitation, the bumps or balls 154 of electrically conductive material may be structurally and electrically bonded to complementary electrical contacts 158 (e.g., bond pads, etc.) on the another structure or device 156. The structure or device 156 may comprise, for example, a higher level substrate, such as a printed circuit board. In some embodiments, the bumps or balls 154 may comprise a solder alloy, and may be structurally and electrically coupled to the electrical contacts 158 using a solder reflow process. In other embodiments, the bumps or balls 154 may comprise a metal or metal alloy having a relatively higher melting point than conventional solder alloys, and may be structurally and electrically coupled to the electrical contacts 158 using a thermo-compression bonding process.

In the method described above with reference to FIGS. 1 through 12, the conductive vias 102 are formed through the substrate 100 to enable the structure of FIG. 11 to be bonded to another structure or device 156 (and the transducer 144 and the integrated circuit electrically interconnected with electrical contacts 158 on the structure or device 156) using a "ball grid array" (BGA) type interconnection. In additional embodiments, other methods may be used to structurally and/or electrically interconnect an integral MEMS device and integrated circuit formed as described herein to another substrate or device. For example, wire bonding methods may be used in additional embodiments of the disclosure, as discussed below with reference to FIGS. 13 through 16.

Figure 13:
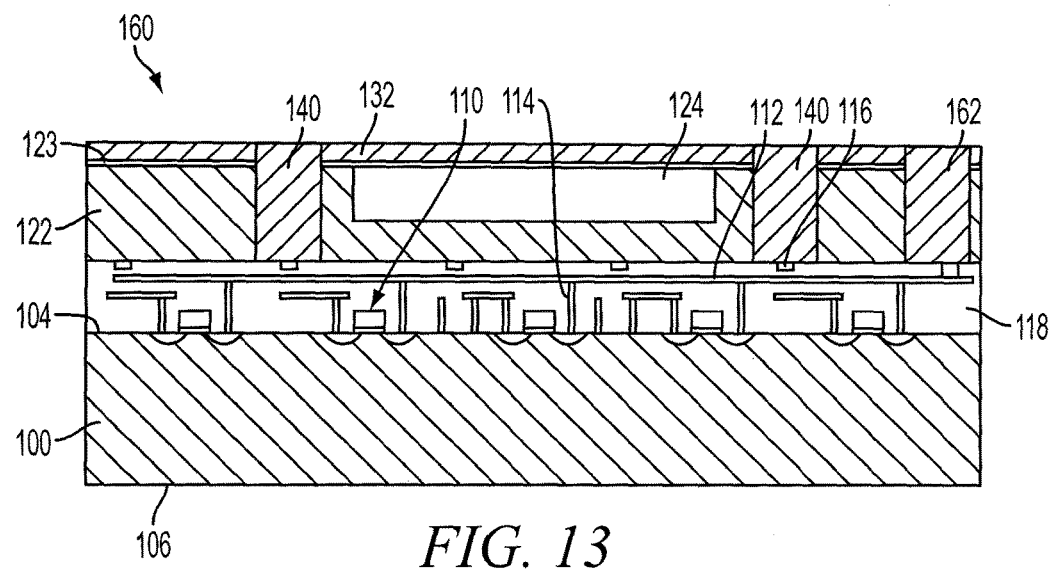
FIGS. 13 through 16 illustrate another example of a method that may be used to form a semiconductor device comprising at least a portion of an integrated circuit and a MEMS device operatively coupled with the integrated circuit, wherein at least a portion of the MEMS device is integrally fabricated over an active surface of the substrate on which the integrated circuit is also formed.

FIG. 13 illustrates a semiconductor structure 160 that is similar to the structure of FIG. 9 and may be formed using methods like those previously described with reference to FIGS. 1 through 9. As shown in FIG. 13, the structure 160 includes the substrate 100, and an integrated circuit formed over a first major surface 104 of the substrate 100. The integrated circuit includes transistors 110, conductive lines 112, conductive vias 114, and contact pads 116. A dielectric material 122 is disposed over the integrated circuit (and over the first major surface 104 of the substrate 100), and a transducer cavity recess 124 extends into a surface 123 of the dielectric material 122. A layer of material 132 is disposed over the major surface 123 of the dielectric material 122, and include a portion that extends over the transducer cavity recess 124. Conductive vias 140 extend through the layer of material 132 and through the dielectric material 122 to conductive features of the integrated circuit, such as to contact pads 116. One or more of the conductive vias 140 may be used to electrically couple a transducer of a MEMS device being fabricated using a portion of the layer of material 132 to the integrated circuit.

As shown in FIG. 13, the substrate 100 may not include any conductive vias 102 (FIG. 9) extending through the substrate 100 from the first major surface 104 to the second major surface 106 of the substrate 100. The structure 160, however, may include one or more electrical contact structures 162 formed over the active surface 104 of the substrate 100. The electrical contact structures 162 ultimately may be used to electrically couple the MEMS device being fabricated and the integrated circuit to another structure or device. As shown in FIG. 13, the electrical contact structures 162 may comprise, for example, additional conductive vias or plugs that extend through the layer of material 132 and the dielectric material 122 to conductive features of the integrated circuit, such as contact pads 116. The electrical contact structures 162 may comprise any of the conductive materials previously mentioned in relation to the conductive vias 102 and the conductive vias 140, and may be fabricated using methods like the methods described in relation to the conductive vias 102 and the conductive vias 140.

Figure 14:
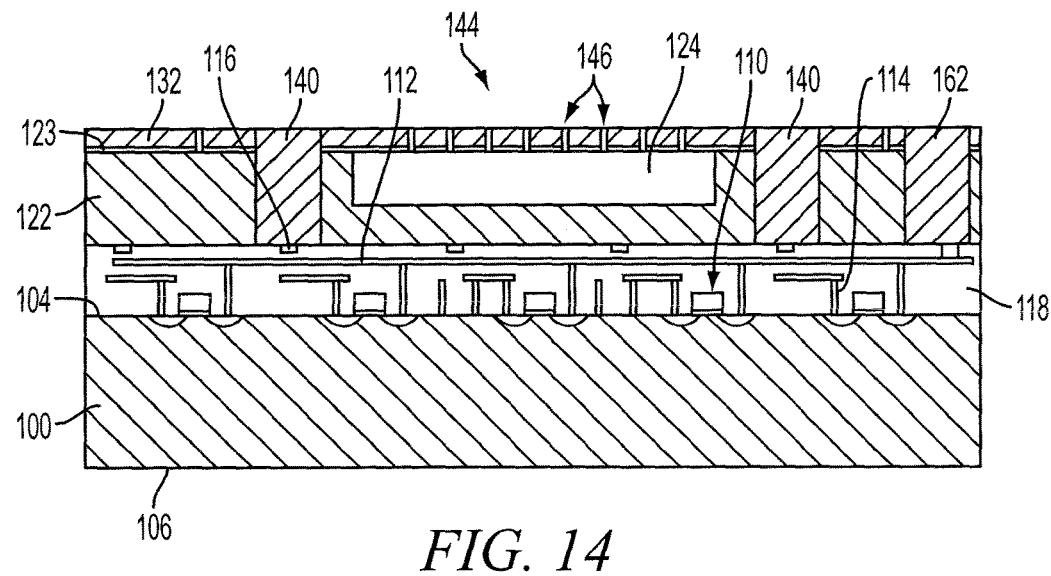

Referring to FIG. 14, a region of the layer of material 132 proximate the transducer cavity recess 124 may be processed to form a transducer 144 over and adjacent the transducer cavity recess 124 as previously described with reference to FIG. 10. By way of example and not limitation, trenches and/or holes 146 may be formed in or through the layer of material 132 proximate the transducer cavity recess 124 to selectively reduce the structural support for a portion of the layer of material 132 to comprise the transducer 144, and/or to electrically isolate regions of the layer of material 132 comprising the transducer 144. As previously mentioned, the transducer 144 may comprise, for example, a resonator, such as a plate acoustic wave resonator, a flexural mode resonator, a bulk acoustic wave (BAW) resonator, a surface acoustic wave (SAW) resonator, or a film bulk acoustic resonator (FBAR). In other embodiments, the transducer 144 may comprise a sensor configured to electrically sense mechanical deformation of, or vibrations in, a portion of the transducer 144. One or more of the conductive vias 140 may be in physical and electrical contact with conductive features, such as contact pads 116, of the integrated circuit, and also in physical and electrical contact with portions of the layer of material 132 that comprise elements or features of the transducer 144, thus providing electrical interconnection between the transducer 144 and the integrated circuit.

Figure 15:
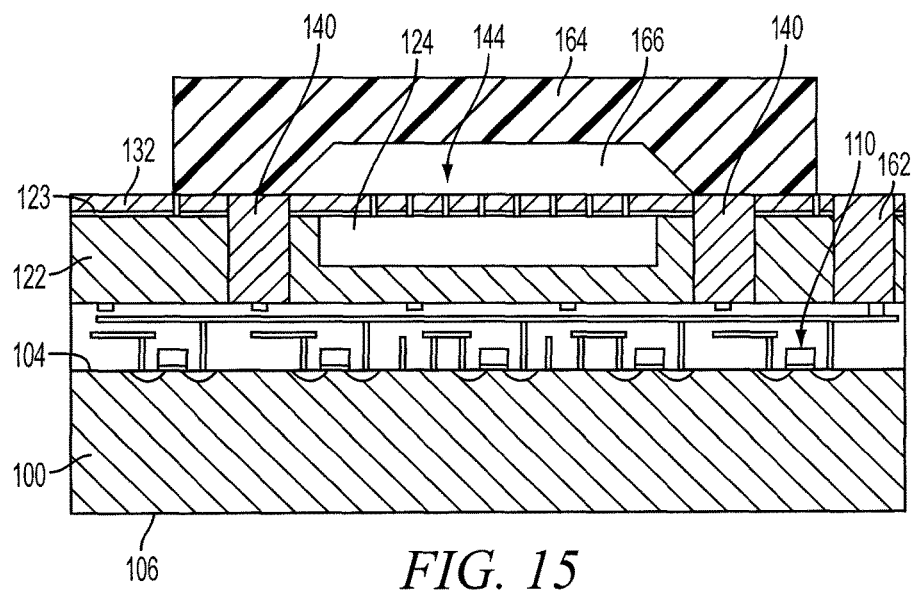
Figure 16:
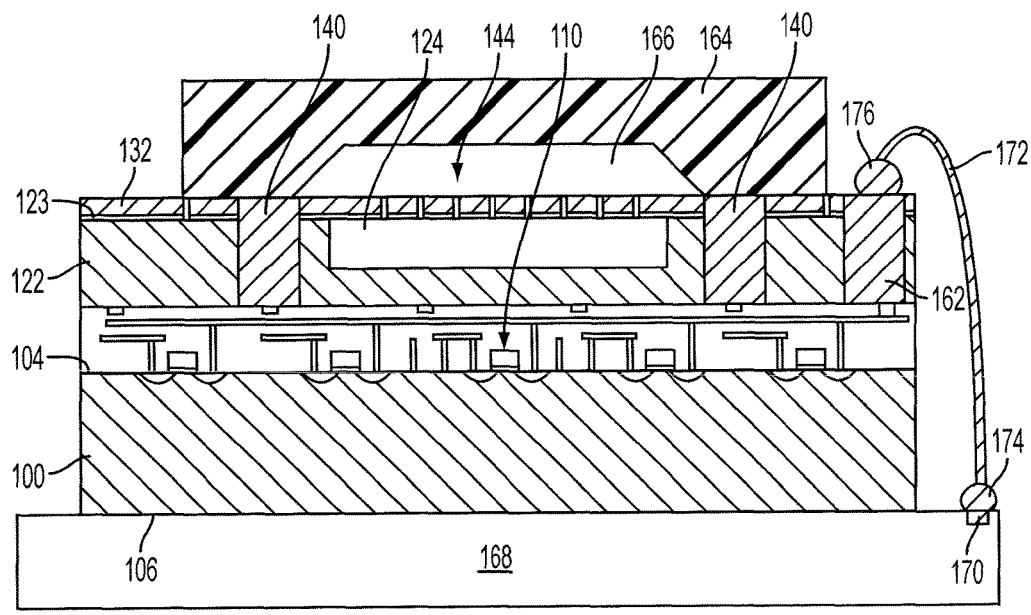

Referring to FIG. 15, a cap structure 164 may be provided over the layer of material 132 and the transducer 144. The cap structure 164 may comprise another transducer cavity recess 166 located and configured to be disposed adjacent the transducer 144 on a side thereof opposite the transducer cavity recess 124 formed in the substrate 100. The transducer cavity recess 166 may be formed in the cap structure 164 prior to bonding the cap structure 164 to the layer of material 132 using processes like those previously discussed in relation to formation of the transducer cavity recess 124. The cap structure 164 may comprise any of the materials previously mentioned in relation to the cap structure 150. The cap structure 164 may be bonded to the layer of material 132 as previously described in relation to the cap structure 150 with reference to FIG. 11.

As shown in FIG. 15, the cap structure 164 may be sized and configured such that the one or more electrical contact structures 162 remain exposed at an outer surface of the structure of FIG. 15 so as to allow later establishment of electrical contact therewith. For example, referring to FIG. 16, the structure of FIG. 15 may be structurally attached to another structure or device 168, and a wire bonding process may be used to electrically interconnect conductive features 170 (e.g., bond pads) of the structure or device 168 with exposed surfaces of the electrical contact structures 162, respectively. In particular, elongated wires 172 may extend respectively between the conductive features 170 of the structure or device 168 and the electrical contact structures 162. A first solder ball 174 may be used to bond a first end of each wire 172 to the conductive feature 170 of the structure or device 168, and a second solder ball 176 may be used to bond an opposite second end of each wire 172 to the electrical contact structure 162. Wire bonding machines for use in performing such wire bonding processes are known in the art and commercially available. The structure or device 168 may comprise, for example, a higher level substrate, such as a printed circuit board, and the second major surface 106 of the substrate 100 may be bonded to the structure or device 168 using an adhesive, for example.

FIGS. 17 through 25 illustrate examples of additional methods of the present disclosure, wherein a semiconductor device is formed that comprises at least a portion of an integrated circuit and a MEMS device operatively coupled with the integrated circuit. At least a portion of the MEMS device is integrally fabricated over an active surface of the substrate on which the integrated circuit is also formed.

Figure 17:
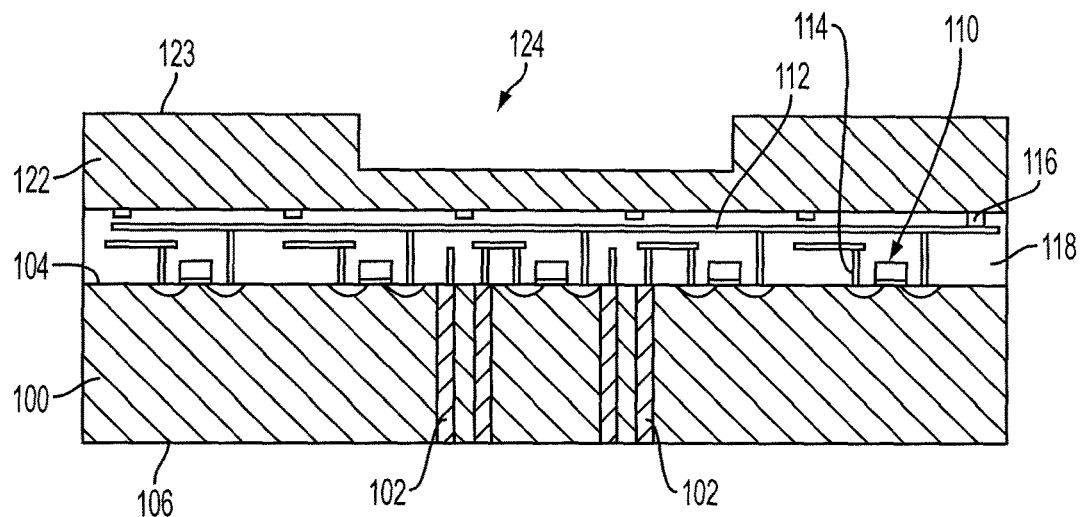
FIGS. 17 through 25 illustrate another example of a method that may be used to form a semiconductor device comprising at least a portion of an integrated circuit and a MEMS device operatively coupled with the integrated circuit, wherein at least a portion of the MEMS device is integrally fabricated over an active surface of the substrate on which the integrated circuit is also formed.

FIG. 17 illustrates a structure like that of FIG. 6. The structure of FIG. 17 may be formed as previously described with reference to FIGS. 1 through 6, and includes the substrate 100, and an integrated circuit formed over a first major surface 104 of the substrate 100. Optionally, conductive vias 102 may extend through the substrate 100 from the first major surface 104 of the substrate 100 to the second major surface 106 of the substrate 100. The integrated circuit includes transistors 110, conductive lines 112, conductive vias 114, and contact pads 116. A dielectric material 122 is disposed over the integrated circuit (and over the first major surface 104 of the substrate 100), and a transducer cavity recess 124 extends into a surface 123 of the dielectric material 122.

Figure 18:
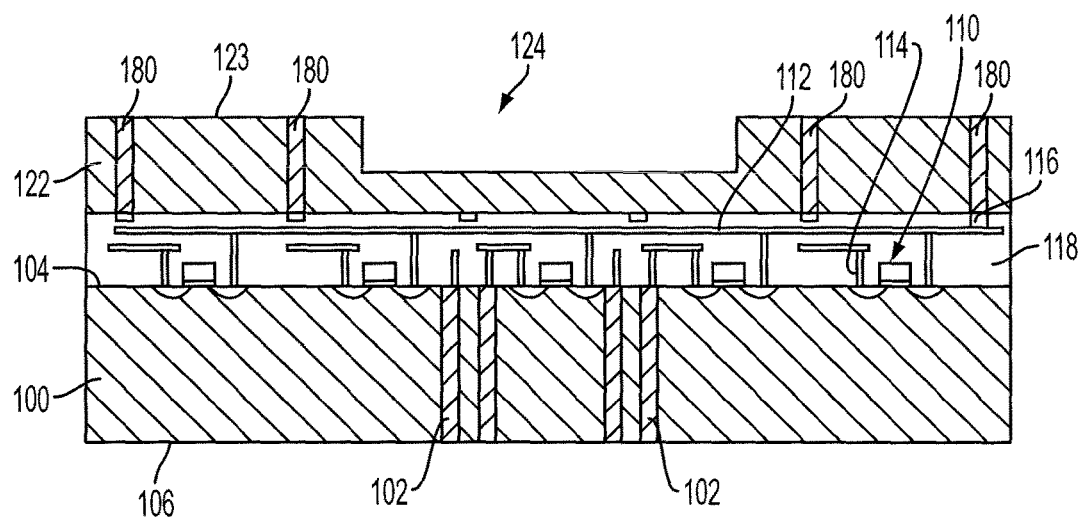

Referring to FIG. 18, conductive vias 180 may be formed from the exposed major surface 123 of the dielectric material 122, through the thickness of the dielectric material 122, to conductive features of the integrated circuit, such as to contact pads 116. One or more of the conductive vias 180 may be used to electrically couple a transducer of a MEMS device being fabricated to the integrated circuit. The conductive vias 180 may comprise any of the materials previously mentioned in relation to the conductive vias 102 and the conductive vias 140, and may be formed as previously described in relation to the conductive vias 102 and the conductive vias 140.

It is noted that the conductive vias 180 may be formed after formation of the transducer cavity recess 124, or the conductive vias 180 may be formed prior to formation of the transducer cavity recess 124. After forming the transducer cavity recess 124 and the conductive vias 180, a separate structure may be fabricated that includes a transducer, and the separately formed transducer structure may be bonded to the dielectric material 122 and over the transducer cavity recess 124, as described below with reference to FIGS. 19 through 24.

Figure 19:
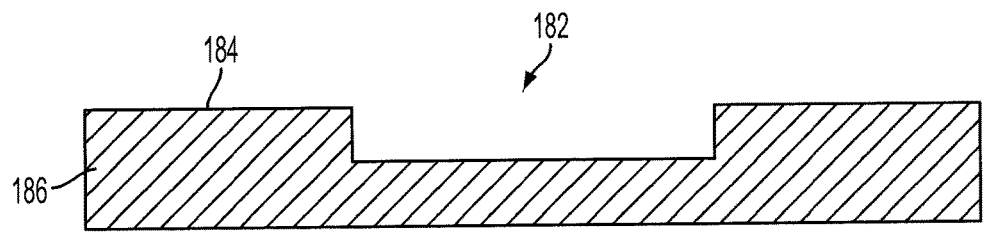

FIG. 19 illustrates another transducer cavity recess 182 formed in a major surface 184 of another substrate 186, which is initially separate from the structure of FIG. 18 and subsequently bonded thereto as discussed below with reference to FIG. 24. With continued reference to FIG. 19, the substrate 186 may comprise any of a number of substrate materials. As non-limiting examples, the substrate 186 may comprise a ceramic such as an oxide (e.g., aluminum oxide, zirconium oxide, silicon oxide, etc.), a nitride (e.g., silicon nitride), or a carbide (e.g., silicon carbide). In other embodiments, the substrate 186 may comprise a semiconductor material (e.g., silicon, germanium, a III-V semiconductor material, etc.) or a metal or metal alloy. The substrate 186 may comprise an amorphous material or a crystalline material (e.g., polycrystalline or monocrystalline material). In some embodiments, the substrate 186 may comprise a multi-layer substrate including two or more of the materials mentioned above. The transducer cavity recess 182, together with the transducer cavity recess 124 of FIG. 18, is ultimately used to form a transducer cavity in which at least a portion of a transducer of a MEMS device is to be disposed. The transducer cavity recess 182 may be formed in the surface 184 of the substrate 186 using, for example, a photolithographic masking and etching process as previously described. The transducer cavity recess 182 may have any desirable size and shape, and the desired size and shape may be at least partially a function of the type of transducer to be formed. In embodiments in which the transducer to be formed comprises a resonator, the frequencies at which the resonator is to resonate may be at least partially a function of the size and shape of the transducer cavity recess 182, and the size and shape of the transducer cavity recess 182 may be designed and selected to provide desirable resonant frequencies.

Figure 20:
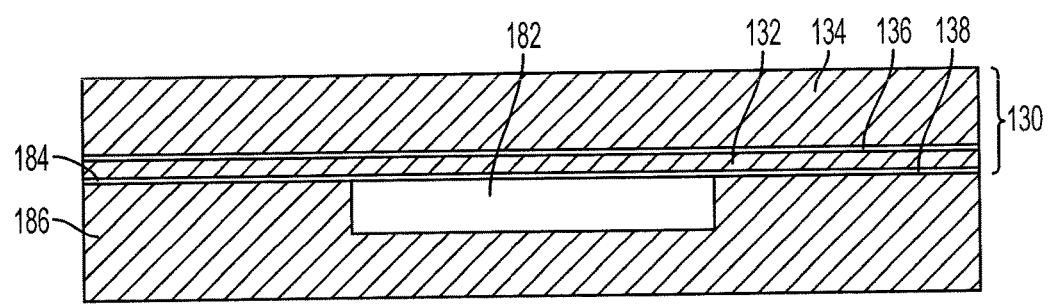

Referring to FIG. 20, an SOI-type structure 130 like that of FIG. 7 is bonded to the surface 184 of the substrate 186 of FIG. 19 such that the layer of material 132 of the SOI-type structure 130 is disposed between the substrate 186 and the bulk material 134. In some embodiments, the layer of material 132 may be bonded to the major surface 184 of the substrate 186 using a direct bonding process as previously described with reference to FIG. 7. As described with reference to FIG. 7, a bonding material 138 may be disposed between the layer of material 132 and the substrate 186 in some embodiments.

Figure 21:
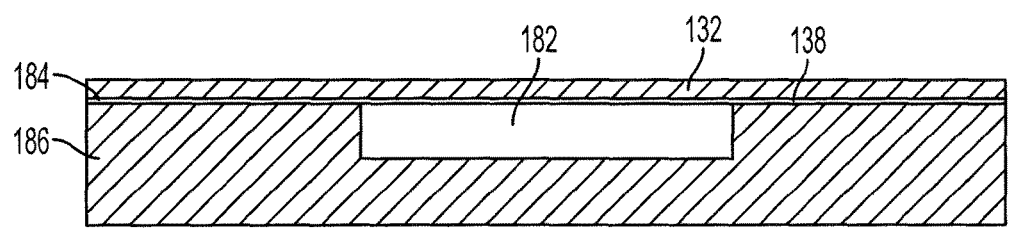

Referring to FIG. 21, after bonding the SOI-type structure 130 (FIG. 20) to the major surface 184 of the substrate 186, the bulk material 134 of the SOI-type structure 130 may be removed leaving the layer of material 132 (and optionally the intermediate material 136) behind and bonded to the substrate 186. In some embodiments, the bulk material 134 of the SOI-type structure 130 may be removed by fracturing the SOI-type structure 130 (FIG. 20) along the intermediate material 136. In other embodiments, one or more of an etching process, a grinding process, and a polishing process (e.g., a chemical-mechanical polishing (CMP) process) may be used to remove the bulk material 134 (and optionally the intermediate material 136).

Figure 22:
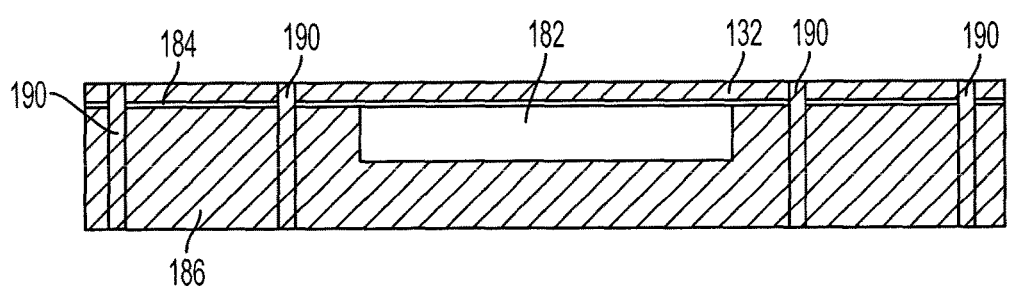

As shown in FIG. 22, conductive vias 190 may be formed through the layer of material 132 and the substrate 186. Thus, the conductive vias 190 may extend entirely through the structure of FIG. 21. One or more of the conductive vias 190 may be located proximate the transducer cavity recess 182, and may be interconnected with a transducer that will comprise a portion of the layer of material 132. The conductive vias 190 may comprise any of the materials previously mentioned in relation to the conductive vias 102 and the conductive vias 140, and may be formed as previously described in relation to the conductive vias 102 and the conductive vias 140.

Figure 23:
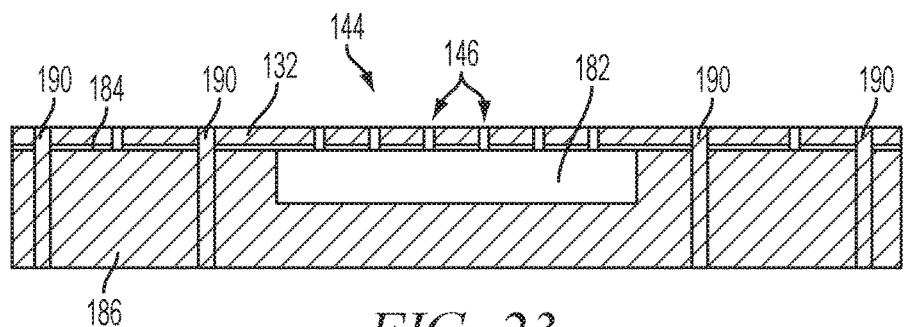

As shown in FIG. 23, a region of the layer of material 132 proximate the transducer cavity recess 182 may be processed to form a transducer 144 over and adjacent the transducer cavity recess 182. By way of example and not limitation, trenches and/or holes 146 may be formed in or through the layer of material 132 proximate the transducer cavity recess 182 to selectively reduce the structural support for a portion of the layer of material 132 to comprise the transducer 144, and/or to electrically isolate regions of the layer of material 132 comprising the transducer 144. As previously mentioned, the transducer 144 may comprise, for example, a resonator, such as a plate acoustic wave resonator, a flexural mode resonator, a bulk acoustic wave (BAW) resonator, a surface acoustic wave (SAW) resonator, or a film bulk acoustic resonator (FBAR). In other embodiments, the transducer 144 may comprise a sensor configured to electrically sense mechanical deformation of, or vibrations in, a portion of the transducer 144.

Figure 24:
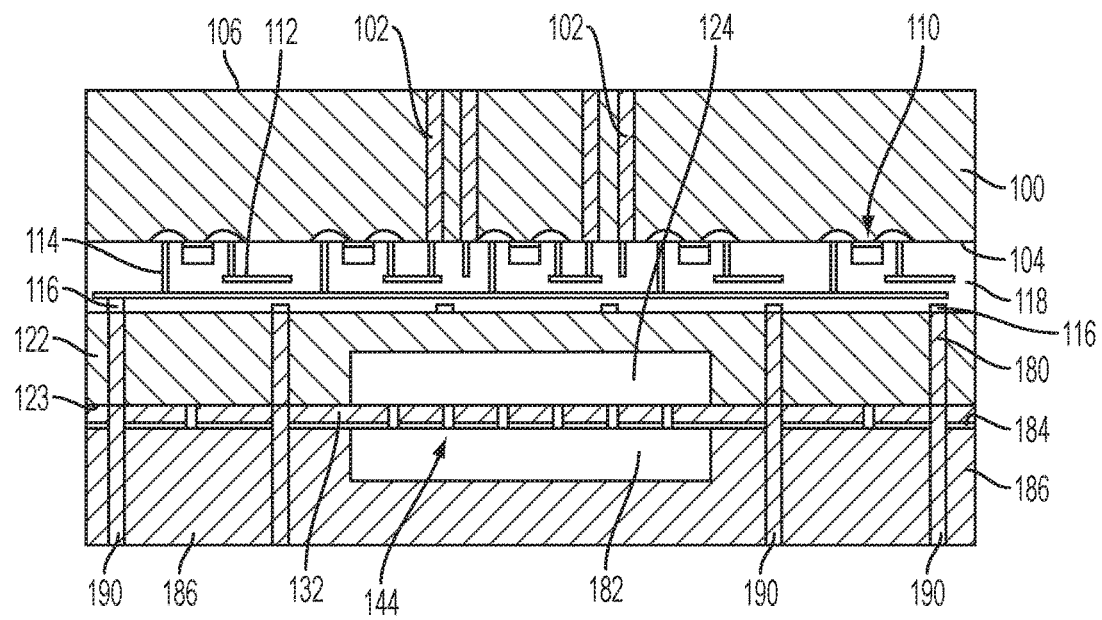

Referring to FIG. 24, the structure of FIG. 23 may be bonded to the structure of FIG. 18 to form the bonded structure shown in FIG. 24. In particular, the layer of material 132 of the structure of FIG. 23 may be bonded to the exposed major surface 123 of the dielectric material 122 in the structure of FIG. 18. The transducer 144 and the transducer cavity recess 182 in the substrate 186 may be aligned with the transducer cavity recess 124 in the dielectric material 122. In this configuration, the transducer 144 is disposed in a transducer cavity defined by the transducer cavity recesses 124, 182. Further, at least a portion of the transducer 144 comprising a region of the layer of material 132 extends unsupported between the recesses 124, 182, such that the portion of the layer of material 132 may physically move (e.g., deflect or vibrate) within the transducer cavity.

The layer of material 132 may be bonded to the exposed major surface 123 of the dielectric material 122 using, for example, a direct bonding process as previously described with reference to FIG. 7. In other embodiments, the layer of material 132 may be bonded to the major surface 123 of the dielectric material 122 using an adhesive.

The transducer 144 may be hermetically sealed between the substrate 186 and the dielectric material 122. In some embodiments, the structure of FIG. 23 may be bonded to the structure of FIG. 18 under vacuum, such that a vacuum is permanently sealed within the transducer cavity recesses 124, 182. In other embodiments, the structure of FIG. 23 may be bonded to the structure of FIG. 18 in an inert gas environment, such that inert gas is permanently sealed within the transducer cavity recesses 124, 182. In yet further embodiments, the structure of FIG. 23 may be bonded to the structure of FIG. 18 under ambient conditions, such that air is permanently sealed within the transducer cavity recesses 124, 182.

Figure 25:
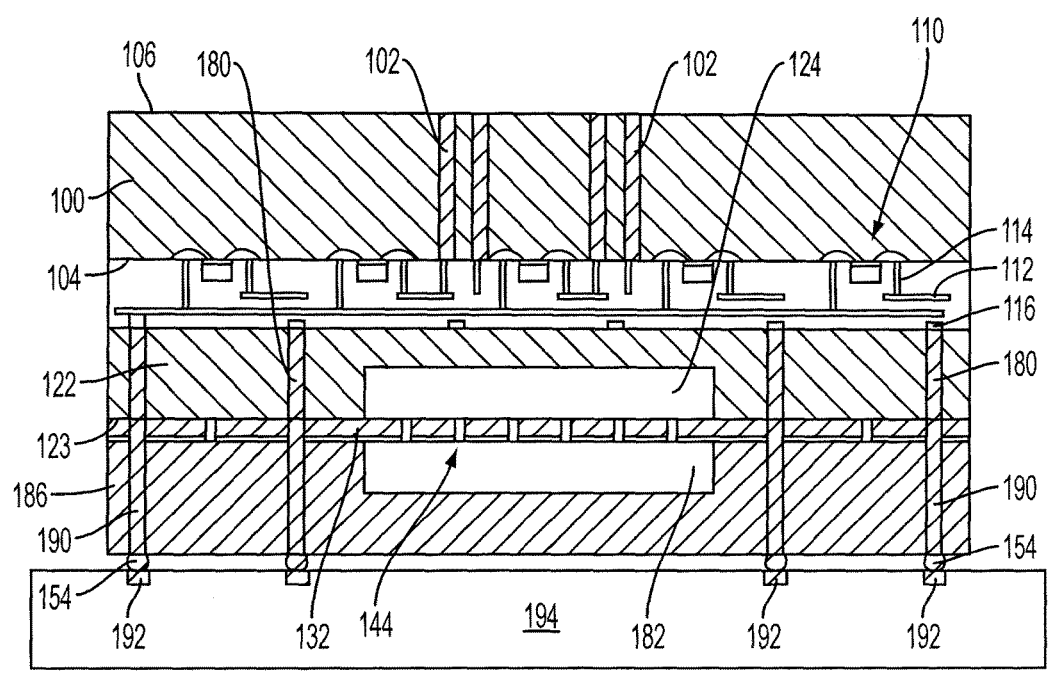

Although the transducer cavity recess 124 and the transducer cavity recess 182 are illustrated in FIGS. 24 and 25 as having at least substantially the same size, in additional embodiments, the transducer cavity recess 124 may be larger or smaller than the transducer cavity recess 182.

As shown in FIG. 25, bumps or balls 154 of electrically conductive metal or metal alloy optionally may be formed over the substrate 186 on a side thereof opposite the transducer 144 and the dielectric material 122. The bumps or balls 154 may be formed as previously described with reference to FIG. 12, and may be in electrical contact with the conductive vias 190 extending through the substrate 186. The structure of FIG. 24 may be structurally and electrically coupled to conductive features 192 of another structure or device 194 using the bumps or balls 154, as shown in FIG. 25. The structure or device 194 may comprise, for example, a higher level substrate, such as a printed circuit board.

As shown in FIG. 25, the optional conductive vias 102 may be exposed at the second major surface 106 of the substrate 100, and may be used, for example, to allow another structure or device (e.g., an electronic signal processor, a memory device, a photoactive device, etc.) to be structurally and electrically connected with the MEMS device and the integrated circuit in the structure of FIG. 25, as needed or desirable. In other embodiments, the conductive vias 102 may not be needed or desirable, and may not be included.

Additional non-limiting example embodiments of the present disclosure are set forth below.

Embodiment 1

A method of forming a semiconductor device comprising an integrated circuit and a microelectromechanical system (MEMS) device operatively coupled with the integrated circuit, comprising: fabricating at least a portion of an integrated circuit on a first major surface of a substrate; and forming a MEMS device over the at least a portion of the integrated circuit on a side thereof opposite the first major surface of the substrate and operatively coupling the MEMS device with the integrated circuit.

Embodiment 2

The method of Embodiment 1, further comprising selecting the MEMS device to comprise at least one of a resonator and a sensor.

Embodiment 3

The method of Embodiment 2, further comprising selecting the MEMS device to comprise at least one of a plate acoustic wave resonator, a flexural mode resonator, a bulk acoustic wave (BAW) resonator, a surface acoustic wave (SAW) resonator, and a film bulk acoustic resonator (FBAR).

Embodiment 4

The method of any one of Embodiments 1 through 3, wherein fabricating the at least a portion of the integrated circuit on the first major surface of the substrate comprises forming at least one transistor on the first major surface of the substrate.

Embodiment 5

The method of any one of Embodiments 1 through 4, wherein fabricating the at least a portion of the integrated circuit on the first major surface of the substrate comprises forming at least one electrically conductive feature over the first major surface of the substrate, the at least one electrically conductive feature electrically coupled with an electrically conductive via.

Embodiment 6

The method of any one of Embodiments 1 through 5, wherein forming the MEMS device over the at least a portion of the integrated circuit comprises integrally forming at least a portion of the MEMS device over the at least a portion of the integrated circuit.

Embodiment 7

The method of Embodiment 6, wherein integrally forming the at least a portion of the MEMS device over the at least a portion of the integrated circuit comprises: depositing a layer of material over the at least a portion of the integrated circuit on a side thereof opposite the first major surface of the substrate; forming at least one transducer cavity recess in an exposed major surface of the layer of material; and providing a transducer on the exposed major surface of the layer of material over the transducer cavity recess.

Embodiment 8

The method of Embodiment 7, wherein providing the transducer on the exposed major surface of the layer of material over the transducer cavity recess comprises: bonding an SOI-type structure to the exposed major surface of the layer of material, the SOI-type structure including a relatively thin layer of material bonded to a relatively thick volume of bulk material with an intermediate material between the relatively thin layer of material and the relatively thick volume of bulk material; removing a portion of the SOI-type structure and leaving the thin layer of material of the SOI-type structure bonded to the layer of material having the at least one transducer cavity recess therein; and configuring a portion of the thin layer of material over the transducer cavity recess to comprise at least a portion of the transducer.

Embodiment 9

The method of Embodiment 7, wherein providing the transducer on the exposed major surface of the layer of material over the transducer cavity recess comprises: forming separately from the substrate a structure comprising a thin layer of material suspended over another transducer cavity recess in another substrate; and bonding the another substrate to the exposed major surface of the layer of material such that a transducer portion of the thin layer of material extends between the transducer cavity recess in the exposed major surface of the layer of material and the another transducer cavity recess in the another substrate.

Embodiment 10

The method of any one of Embodiments 1 through 9, further comprising forming a conductive via and electrically coupling the MEMS device to the at least a portion of the integrated circuit using the conductive via.

Embodiment 11

The method of any one of Embodiments 1 through 10, further comprising forming a conductive via extending through the substrate from the first major surface of the substrate to a second major surface of the substrate.

Embodiment 12

The method of Embodiment 11, further comprising operably coupling the MEMS device and the at least a portion of the integrated circuit to a conductive feature of another structure or device by electrically interconnecting the conductive feature of the another structure or device to an end of the conductive via exposed at the second major surface of the substrate.

Embodiment 13

The method of any one of Embodiments 1 through 11, further comprising operably coupling the MEMS device and the at least a portion of the integrated circuit to a conductive feature of another structure or device using a wire bond.

Embodiment 14

A semiconductor structure, comprising: at least a portion of an integrated circuit formed on a first major surface of a substrate; and a MEMS device comprising a transducer disposed over the at least a portion of the integrated circuit and the first major surface of the substrate.

Embodiment 15

The semiconductor structure of Embodiment 14, wherein the transducer comprises at least one of a resonator and a sensor.

Embodiment 16

The semiconductor structure of Embodiment 15, wherein the transducer comprises at least one of a plate acoustic wave resonator, a flexural mode resonator, a bulk acoustic wave (BAW) resonator, a surface acoustic wave (SAW) resonator, and a film bulk acoustic resonator (FBAR).

Embodiment 17

The semiconductor structure of any one of Embodiments 14 through 16, wherein the at least a portion of the integrated circuit on the first major surface of the substrate comprises at least one transistor on the first major surface of the substrate.

Embodiment 18

The semiconductor structure of any one of Embodiments 14 through 17, wherein at least a portion of the MEMS device is integrally formed over the at least a portion of the integrated circuit.

Embodiment 19

The semiconductor structure of Embodiment 18, wherein the at least a portion of the MEMS device integrally formed over the at least a portion of the integrated circuit comprises: a layer of material over the at least a portion of the integrated circuit on a side thereof opposite the first major surface of the substrate; at least one transducer cavity recess extending into an exposed major surface of the layer of material; and a transducer on the exposed major surface of the layer of material over the transducer cavity recess.

Embodiment 20

The semiconductor structure of Embodiment 18, wherein the at least a portion of the MEMS device integrally formed over the at least a portion of the integrated circuit comprises: another substrate bonded over the exposed major surface of the layer of material; another transducer cavity recess extending into the another substrate; and a thin layer of material extending between the transducer cavity recess in the exposed major surface of the layer of material and the another transducer cavity recess in the another substrate, at least a portion of the thin layer of material comprising the transducer.

Embodiment 21

The semiconductor structure of any one of Embodiments 14 through 20, further comprising a conductive via electrically coupling the MEMS device to the at least a portion of the integrated circuit.

Embodiment 22

The semiconductor structure of any one of Embodiments 14 through 21, further comprising a conductive via extending through the substrate from the first major surface of the substrate to a second major surface of the substrate.

Embodiment 23

The semiconductor structure of Embodiment 22, further comprising another structure or device having at least one conductive feature structurally and electrically coupled to an end of the conductive via exposed at the second major surface of the substrate.

Embodiment 24

The semiconductor structure of any one of Embodiments 14 through 22, further comprising another structure or device having at least one conductive feature electrically coupled to the at least a portion of the integrated circuit and the MEMS device by a wire bond.

Embodiment 25

An electronic device, comprising: a substrate having an active surface and an opposing back surface; active components of an integrated circuit on the active surface of the substrate; a MEMS transducer over the active components of the integrated circuit on a side thereof opposite the active surface of the substrate; and a conductive via electrically coupling the MEMS transducer to an active component of the integrated circuit on the active surface of the substrate.

Embodiment 26

The electronic device of Embodiment 25, wherein the MEMS transducer comprises at least one of a plate acoustic wave resonator, a flexural mode resonator, a bulk acoustic wave (BAW) resonator, a surface acoustic wave (SAW) resonator, and a film bulk acoustic resonator (FBAR).

Embodiment 27

The electronic device of Embodiment 25 or Embodiment 26, wherein at least a portion of the MEMS device is integrally formed over the integrated circuit on the active surface of the substrate.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A method of forming a semiconductor device comprising an integrated circuit and a microelectromechanical system (MEMS) device operatively coupled with the integrated circuit, comprising:
    fabricating at least a portion of an integrated circuit on a first major surface of a semiconductor substrate;
    depositing a layer of material over the at least a portion of the integrated circuit on a side thereof opposite the first major surface of the semiconductor substrate;
    forming at least one transducer cavity recess in an exposed major surface of the layer of material; bonding an SOI-type structure to the exposed major surface of the layer of material the SOI-type structure including a relatively thin layer of material bonded to a relatively thick volume of bulk material with an intermediate material between the relatively thin layer of material and the relatively thick volume of bulk material; removing a portion of the SOI-type structure and leaving the thin layer of material of the SOI-type structure bonded to the layer of material having the at least one transducer cavity recess therein;
    configuring a portion of the thin layer of material over the transducer cavity recess to comprise at least a portion of a transducer so as to integrally form at least a portion of a MEMS device over the at least a portion of the integrated circuit on a side thereof opposite the first major surface of the semiconductor substrate; and
    operatively coupling the MEMS device with the integrated circuit.

2. The method of claim 1, wherein fabricating the at least a portion of the integrated circuit on the first major surface of the semiconductor substrate comprises forming at least one transistor on the first major surface of the semiconductor substrate.

3. The method of claim 2, wherein fabricating the at least a portion of the integrated circuit on the first major surface of the semiconductor substrate further comprises forming at least one electrically conductive feature over the first major surface of the semiconductor substrate, the at least one electrically conductive feature electrically coupled with the with an electrically conductive via.

4. The method of claim 1, further comprising forming a conductive via extending through the layer of material and electrically coupling the MEMS device to the at least a portion of the integrated circuit.

5. The method of claim 4, further comprising forming another conductive via extending through the semiconductor substrate from the first major surface of the semiconductor substrate to a second major surface of the semiconductor substrate.

6. The method of claim 5, further comprising operably coupling the MEMS device and the at least a portion of the integrated circuit to a conductive feature of another structure or device by electrically interconnecting the conductive feature of the another structure or device to an end of the another conductive via exposed at the second major surface of the semiconductor substrate.

7. The method of claim 1, further comprising operably coupling the MEMS device and the at least a portion of the integrated circuit to a conductive feature of another structure or device using a wire bond.

* * * * *

UNITED STATES PATENT AND TRADEMARK OFFICE
CERTIFICATE OF CORRECTION

PATENT NO. : 9,511,996 B2  Page 1 of 1
APPLICATION NO. : 14/416860
DATED : December 6, 2016
INVENTOR(S) : Mariam Sadaka et al.

It is certified that error appears in the above-identified patent and that said Letters Patent is hereby corrected as shown below:

In the Specification
    Column 5,    Line 60,    change "108 foiled on the" to --108 formed on the--
    Column 9,    Line 18,    change "(100 pin), or" to --(100 µm), or--
    Column 12,    Line 36,    change "may be framed in" to --may be formed in--

In the Claims
Claim 1,    Column 22,    Line 49,    change "of material the" to --of material, the--
Claim 3,    Column 23,    Lines 9-10,    change "with the with an" to --with an--

Signed and Sealed this
Third Day of October, 2017

Joseph Matal
*Performing the Functions and Duties of the*
*Under Secretary of Commerce for Intellectual Property and*
*Director of the United States Patent and Trademark Office*